(12) United States Patent
Wang

(10) Patent No.: US 7,245,279 B2
(45) Date of Patent: Jul. 17, 2007

(54) LINEAR LED ARRAY

(75) Inventor: Xiao-Ping Wang, 17220 Newhope St. #127, Fountain Valley, CA (US) 92708

(73) Assignee: Xiao-Ping Wang, Jiading, Shanghai (CN)

( * ) Notice: Subject to any disclaimer, the term of this patent is extended or adjusted under 35 U.S.C. 154(b) by 620 days.

(21) Appl. No.: 10/728,152

(22) Filed: Dec. 4, 2003

(65) Prior Publication Data

US 2005/0122293 A1    Jun. 9, 2005

(51) Int. Cl.
*G09G 3/34* (2006.01)
(52) U.S. Cl. .............................. 345/84; 345/55; 362/240
(58) Field of Classification Search ................. 345/46, 345/84, 55; 340/815.45; 362/240, 248, 362/267
See application file for complete search history.

(56) References Cited

U.S. PATENT DOCUMENTS

| 6,329,593 | B1 * | 12/2001 | Yang ........................... 174/559 |
| 6,364,507 | B1 * | 4/2002 | Yang ........................... 362/248 |
| 6,448,900 | B1 * | 9/2002 | Chen ..................... 340/815.45 |
| 6,501,084 | B1 * | 12/2002 | Sakai et al. ............. 250/504 R |
| 2003/0189829 | A1 * | 10/2003 | Shimizu et al. ............. 362/240 |

* cited by examiner

*Primary Examiner*—Richard Hjerpe
*Assistant Examiner*—Kimnhung Nguyen
(74) *Attorney, Agent, or Firm*—Clement Cheng, Esq.

(57) ABSTRACT

A chain of LEDs is formed from link units connected by wire pairs in electrical circuit. At least one wire pair is connected to a link unit to form external power supply wires. Each link unit is made of a tray housing a PCB in the housing, and LEDs mounted on the PCB in electrical connection with the wire pairs. Cured waterproof resin inside the tray housing encases the printed circuit board, the wire pair connection point to the PCB and the lower half of the light emitting diode elements.

14 Claims, 2 Drawing Sheets

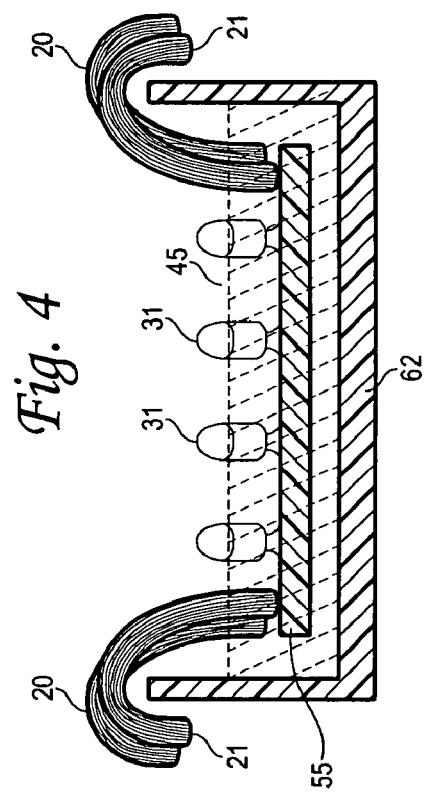
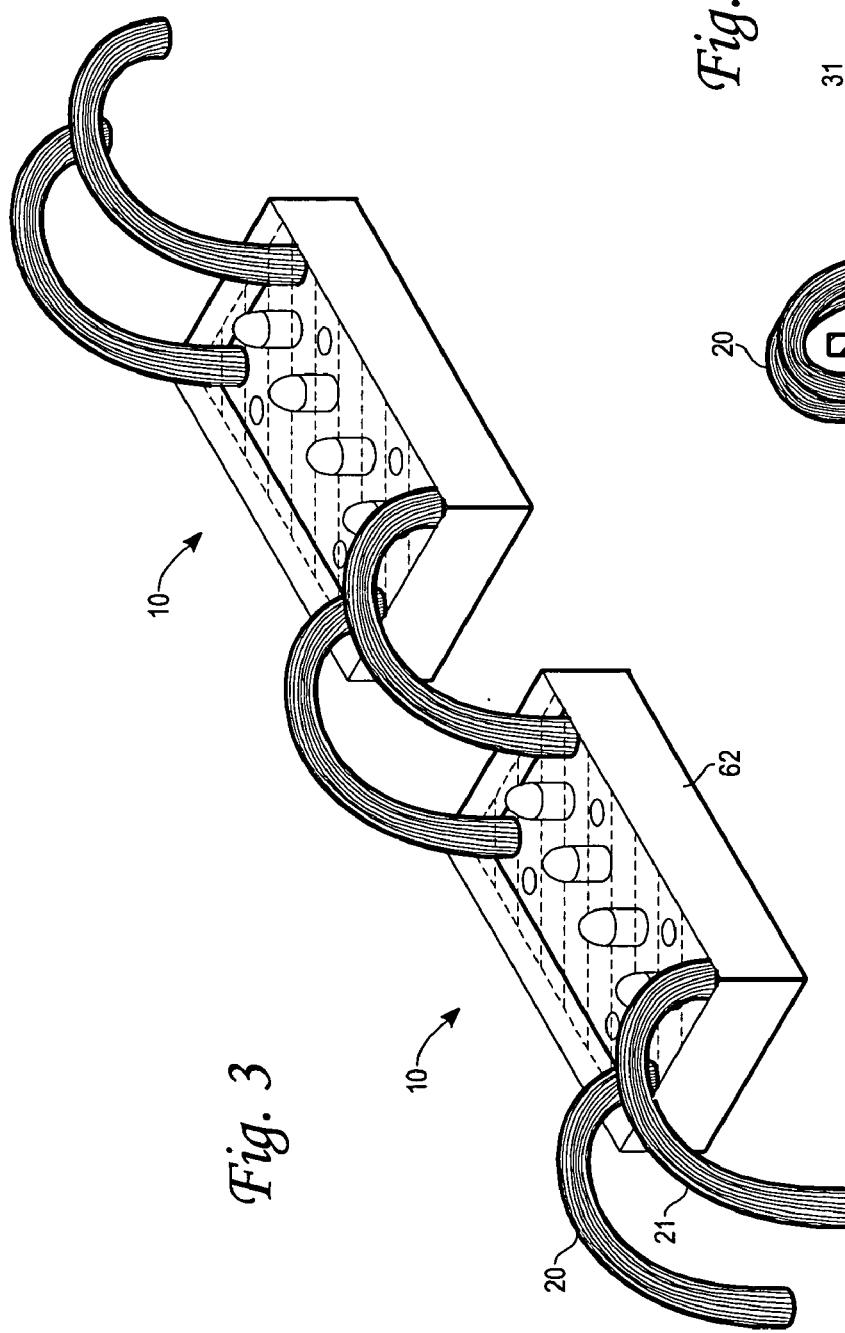

LINEAR LED ARRAY

BACKGROUND OF THE INVENTION

1. Field of the Invention

The present invention relates to a light emitting diode (LED) display array, and more particularly to a waterproof LED display array that has a watertight housing.

2. Description of Related Art

Light emitting diode (LED) displays are often used in signboard advertising. LED displays normally comprise a rectangular or hex array of LEDs mounted on one or more printed circuit boards (PCB) controlled by special hardware and/or software to perform certain images on a screen to provide images to attract the attention of potential customers. Such LED displays are also widely used by families or individuals for other purposes, such as Christmas tree decorations.

In numerous occasions, such LED displays must be placed outdoors. As a result, an LED display with waterproof function becomes desirable. Traditional covered LED displays, such as U.S. Pat. No. 6,501,084 by Sakai et al, show a housing with a cover and several LEDs mounted on a PCB inside the housing. However, if the waterproof cover was not sealed properly, water or water vapor can easily penetrate the LED display so that the LED display will fail quickly.

Another kind of waterproof LED display has also been commonly used, as seen in U.S. Pat. No. 6,364,507 by Yang. Waterproof silica gel is spread over joints between the joints between the panel and the housing. Unfortunately, Yang's invention was designed mainly for larger LED commercial displays and it is comparatively difficult to expand the number of the units.

SUMMARY OF THE INVENTION

The main objective of the present invention is to provide an LED display array that is entirely waterproof. The second objective of the present invention is to provide an LED array which is easily extendable, from at least one set of the LED display unit to as many as the users prefer for any particular needs in comparatively low cost. The third objective of the present invention is to provide an LED array that is easy to be set up.

Advantages of the Invention

The present invention provides an easily extendable design of waterproof LED display array. The LED display unit is made to function separately, and each LED display unit has its own waterproof arrangement, as it lowers the cost extending the length of the array.

Such design can be used as substitute of neon lights, while simply allowing the user to wire such LED display array around already existed structure, such as non-glimmering advertisement. It provides flexibility and great economic savings for the users.

BRIEF DESCRIPTION OF THE DRAWINGS

FIG. 3 is a perspective view.

FIG. 4 is a side cross section view.

DETAILED DESCRIPTION OF THE PREFERRED EMBODIMENT

Electrical Description

Figure 1:
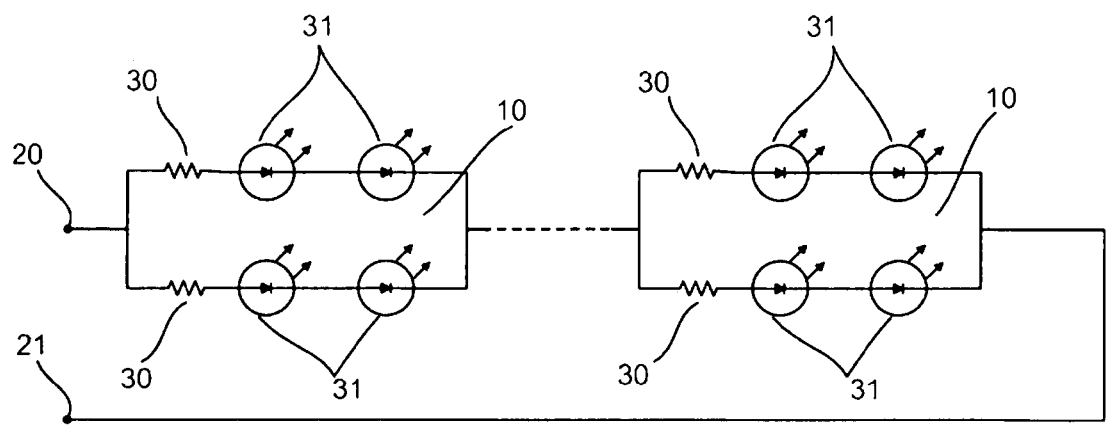
FIG. 1 is a theoretical circuit diagram showing of the present invention.
Figure 2:
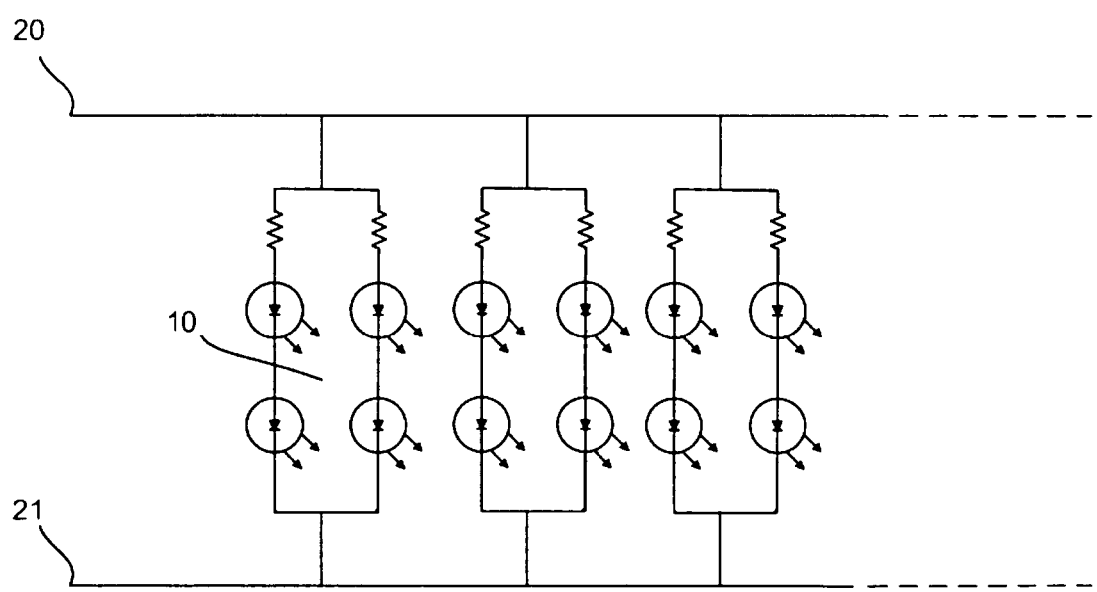
FIG. 2 is a physical linkage circuit diagram showing external power supply.

FIG. 1 illustrates a theoretical circuit equivalent of the first embodiment of the LED extensible array. The external power source portions are abstract, emphasizing the linkage of the units. FIG. 2 illustrates the second embodiment of the present invention, showing the parallel link of the external power supplies.

As shown in FIG. 1, the LED display unit 10 consists four light emitting diode (LED) elements 31 separately connected as two pairs. Two pairs of LED elements 31 are connected in parallel to the external power source. The power source supplies power to the LED elements 31 via the resistors 30. The resistors 30 are connected to an anode of each pair of LED elements 31.

In operation, the character of the resistor 30s can be applied according to a user's demand. In preferred embodiment, the resistor 30 value of 27Ω/0.25 w is favored. The LED elements 31, at the same time, can also be selected from variety of different volumes. In present invention, red, blue, green, amber, and white LED elements 31 are described, but other colors can also be used.

The DC power supply is preferably to be set at 12V. A standard power supply with the capability producing an output of 12V from commonly used AC 100-120V/0.8 A is preferred. The power can also be up to 36V DC, but preferably above 2V DC. The external power supply connects to each LED display unit 10 individually and separately. The external power supply consists a positive power source 20 and a negative power source 21. The positive voltage power source 20 connects to the anode ends of each LED elements 31 through resistor 30s, while the negative voltage power source 21 connects to the cathode ends of each LED elements 31. Two LED elements 31 are connected serially with one resistor 30 connected to the anode end, constituting an LED group. Two LED groups connect in parallel to the external power source, constituting one LED display unit 10.

As shown in FIG. 2, the number of LED display unit 10 is extendable by simply adding extra LED display units 10 in chain. The procedure can be done by connecting the positive voltage supply to the anode ends of each LED group and connecting the negative voltage supply to the cathode ends of each LED groups.

Each individual LED or a pair of LEDs is preferably constructed in a parallel configuration within the unit 10. The parallel configuration assures that the failure of a single LED or a failure of a pair of LEDs does not lead to failure of all LEDs within the unit 10. Other analogous circuits can be used for LED lamps having different voltages and current limitations.

Mechanical Description

The physical embodiment of the invention appears as a chain of tray links. The intermediate wire connections are flexible allowing flexibility of the entire chain of tray links. Each tray corresponds with a unit 10. Each link formed as a rectangular tray is preferably white in color and made of plastic. The white plastic trays are linked together by strands of wire that are preferably color neutral such as gray and white, or gray and black. The chain of trays can receive hook and loop tape on the underside of each tray so that the chain can be attached to a display sign. Common display signs include lettering such that the chain can be inserted inside and mounted inside the display sign.

The chain has positive and negative electrical leads that power the chain. The electrical leads protrude from both ends of the chain. The pair of positive and negative leads as a first end can be powered, or the pair of positive and negative leads at the second end can be powered. A user can interchange the end from which the device is powered. The parallel circuit allows a user to cut off links of the chain to a desired length. A user can use a pair of scissors to cut the wire strands holding the links together. The external power supply is connected to the positive and negative electrical leads at either end. A wide variety of external power supplies can be used. These external power supplies are well-known in the art and not a discussion subject of this application.

Each link 10 is a plastic tray, which can be made of PVC or polycarbonate material. The trays each hold a plurality of LED's in linear configuration pointing upward. The plastic trays are linked together by one or more strands of wire pairs with positive and negative leads. Each individual LED display unit has a housing 62 on which a top opening is formed. The housing has an elongate and rectangular box shape. The opening is formed on the upper end of the housing so that the housing resembles a tray 62.

Inside the housing is set a printed circuit board PCB 55. The PCB 55 has an elongate rectangular plate shape corresponding to and fitting inside the housing 62. Following the circuit design, required number of LED elements 31 is soldered on a PCB 55, along with required number of resistors 30. Preferably four LED elements and two resistors are accommodated on one PCB 55. Plural or four LED elements 31 are mounted on an upper side of the PCB 55 so that its light emitting side is faced to the opening of the housing. The LED elements 31 are disposed at predetermined intervals in the longitudinal direction. An external power source supplies power to the LED elements and other electrical elements via the leads. The leads are secured to the front and rear ends of the housing.

The PCB can be coated with reflective material to direct light outwards. The PCB can also be covered with a reflector mirror surface either integrally formed or laying on top of the PCB so that LED light is directed upward. The resin covers the reflective surface in both cases.

An outer cover 45 is attached to the opening of the housing. The gel spreads over the PCB and preferably through the PCB via holes in the PCB board allowing flow. The liquid gel flows around the edges of the PCB providing a watertight seal for all elements on the PCB. The level of the liquid is defined as the surface 45 of the outer cover. The cover has an elongate rectangular shape corresponding to the inner edge of the opening. The outer cover is a waterproof resin that has certain predetermined openings allowing the light-emitting portion of the LED elements to protrude into the ambient atmosphere. The housing under the outer cover is closely attached to the housing, sealing the PCB and other electrical elements inside the housing.

The unit 10 is made by preparing a layer of waterproof epoxy gel spread on and over the covered housing with the PCB and the LED elements inside the housing. The gel is also spread on and over the light emitting portion of the LED elements and the necessary power supply wires. Optionally, an electrical heat shrink cover can envelop the lower portion of the LED before the lower portion of the LED is encased within the epoxy gel. The electrical heat shrink cover formed as a tube fitted over the LED, provides a watertight seal with the LED becoming integrally formed with the LED such that it becomes the bottom portion of the LED.

The waterproof gel is preferably formed from epoxy resin but can be made of a variety of other materials. The PCB and related elements is encased inside the housing.

The liquid is cured to a solid state upon heating. A certain heating time upon the LED unit may be required to cure to waterproof standards. In the preferred embodiment, eight hours heating time in oven is favored.

The invention claimed is:

1. A waterproof LED chain comprising:
   a plurality of link units;
   a plurality of wire pairs connecting the link units in electrical series;
   at least one wire pair connected to a link unit to form external power supply wires;
   each link unit comprising at least: a tray housing; a PCB securely received in the housing; a plurality of light emitting diode elements mounted on the PCB in electrical connection with the wire pairs at a wire pair connection point; and cured waterproof resin inside the tray housing encasing the printed circuit board, the wire pair connection point to the PCB and a lower half of the light emitting diode elements;
   wherein the cured waterproof resin inside the tray housing encasing the lower half of the light emitting diode elements forms a surface defining an outer cover sealing an opening of the tray housing to enclose the PCB, wherein the outer cover has a plurality of apertures corresponding to the number of said LED elements and the external power wires at a location where the LED elements and the external power wires protrude from the cured waterproof resin.

2. The waterproof LED chain of claim 1, wherein said housing and said outer cover are made of PVC material.

3. The waterproof LED chain of claim 1, wherein a light-emitting portion of the diode elements protrudes outside the housing.

4. The waterproof LED chain of claim 1, wherein a plurality of resistors is included in the electrical circuit for matching LED elements.

5. The waterproof LED chain of claim 1, wherein the LED elements are arranged in a linear configuration within each tray housing.

6. A waterproof LED chain made by the following steps:
   a. soldering a plurality of LED elements at an LED bottom portion to a plurality of PCBs to create a plurality of prepared PCBs units, wherein at least a pair of LEDs are connected to each PCB,
   b. soldering a plurality of wire pairs at the end of each PCB at wire connection points to form a continuous chain of prepared PCB units, each wire pair consisting of a positive and negative wire,
   c. placing a prepared PCB unit each having LED elements mounted on it into a tray housing, then pouring liquid epoxy resin into the tray sealing the wire connection points and bottom portion of the LED elements,
   d. curing the epoxy resin.

7. The waterproof LED chain of claim 6, wherein each tray housing is rectangular in shape, and each PCB is rectangular in shape.

8. The waterproof LED chain of claim 6, further comprising the step of including a plurality of resistors in the electrical circuit for matching the voltage of LED elements.

9. The waterproof LED chain of claim 6, wherein the LED elements are arranged in a linear configuration within each tray housing.

10. The waterproof LED chain of claim 6, wherein each tray housing is rectangular in shape, and each PCB is rectangular in shape.

11. The waterproof LED chain of claim 6, wherein the LED elements are arranged in a linear configuration within each tray housing.

12. The waterproof LED chain of claim 6, wherein each tray housing is rectangular in shape, and each PCB is rectangular in shape.

13. The waterproof LED chain of claim 6, further including an electrical heat shrink cover formed as a tube fitted over the LED, which provides a watertight seal with the LED becoming integrally formed with the LED such that it becomes the bottom portion of the LED.

14. A waterproof LED chain comprising:
a plurality of link units;
a plurality of wire pairs connecting the link units in electrical series;
at least one wire pair connected to a link unit to form external power supply wires;
each link unit comprising at least: a tray housing; a PCB securely received in the housing; a plurality of light emitting diode elements mounted on the PCB in electrical connection with the wire pairs at a wire pair connection point; and cured waterproof resin inside the tray housing encasing the printed circuit board, the wire pair connection point to the PCB and the lower half of the light emitting diode elements;
wherein the cured waterproof resin inside the tray housing encasing the lower half of the light emitting diode elements forms a surface defining an outer cover sealing the opening of the tray housing to enclose the PCB, wherein the outer cover has a plurality of apertures corresponding to the number of said LED elements and the external power wires at a location where the LED elements and the external power wires protrude from the cured waterproof resin.

* * * * *